(12) United States Patent
Besserer et al.

(10) Patent No.: US 7,715,201 B2
(45) Date of Patent: May 11, 2010

(54) HOUSING OR FRAME-LIKE HOLDING ELEMENT WITH AN INSCRIBED STRIP

(75) Inventors: Horst Besserer, Herborn (DE); Martin Lang, Driedorf (DE)

(73) Assignee: Rittal GmbH & Co. KG, Herborn (DE)

( * ) Notice: Subject to any disclaimer, the term of this patent is extended or adjusted under 35 U.S.C. 154(b) by 607 days.

(21) Appl. No.: 11/629,114

(22) PCT Filed: Sep. 9, 2005

(86) PCT No.: PCT/EP2005/009707

§ 371 (c)(1),
(2), (4) Date: Dec. 8, 2006

(87) PCT Pub. No.: WO2006/042591

PCT Pub. Date: Apr. 27, 2006

(65) Prior Publication Data

US 2008/0259573 A1    Oct. 23, 2008

(30) Foreign Application Priority Data

Oct. 15, 2004   (DE) ...................... 10 2004 050 498

(51) Int. Cl.
*H05K 5/00* (2006.01)
(52) U.S. Cl. ................... 361/752; 361/790; 361/800
(58) Field of Classification Search ............... 361/752, 361/790, 797, 800, 730; 312/223
See application file for complete search history.

(56) References Cited

U.S. PATENT DOCUMENTS

| | | | | |
|---|---|---|---|---|
| 5,613,874 A | * | 3/1997 | Orlando et al. ............. | 439/491 |
| 6,163,996 A | * | 12/2000 | Gebka ...................... | 40/661.03 |
| 6,215,067 B1 | * | 4/2001 | Chen ............................ | 174/66 |
| 6,226,910 B1 | * | 5/2001 | Ireland ..................... | 40/661.03 |
| 6,481,133 B1 | * | 11/2002 | DeSena ................... | 40/661.03 |
| 6,935,061 B2 | * | 8/2005 | Thompson ............... | 40/661.03 |
| 7,353,629 B2 | * | 4/2008 | Caveney et al. .......... | 40/299.01 |
| 7,455,081 B2 | * | 11/2008 | Bacnik .................... | 40/661.03 |

FOREIGN PATENT DOCUMENTS

| | | |
|---|---|---|
| CH | 429 872 | 8/1967 |
| CH | 610 463 | 3/1977 |
| DE | 1 749 079 | 7/1957 |
| DE | 34 03 114 A1 | 8/1985 |
| DE | 94 21 342 U1 | 10/1995 |
| EP | 0 902 515 A1 | 3/1999 |

* cited by examiner

*Primary Examiner*—Hung S Bui
(74) *Attorney, Agent, or Firm*—Pauley Petersen & Erickson

(57) ABSTRACT

A housing or a frame-like holding element for, in particular, electronic or electrical components, including a frame that surrounds an opening, a holding fixture that, while extending in a longitudinal direction, is formed in the front side of at least one profile. An inscribed strip is placed inside the holding fixture and supports a holding strip that forms a viewing surface on the front side. This invention provides a holding element that can be easily assembled while having a visually appealing layout of the inscribed strip. This invention provides frame limbs forming the frame in the form of frame profiles, of which the holding fixture for the inscribed strip is formed on at least one, and the holding strip, on a rear side facing away from the viewing side, has two longitudinally extending resilient detent webs which are parallel to one another and which have detent elements that engage in a locking manner within detent mating elements formed on the holding fixture.

18 Claims, 2 Drawing Sheets

HOUSING OR FRAME-LIKE HOLDING ELEMENT WITH AN INSCRIBED STRIP

BACKGROUND OF THE INVENTION

1. Field of the Invention

This invention relates to a housing or a frame-like holding element, in particular for electronic or electrical components, having a frame that surrounds an opening, a holding fixture positioned in the front side of at least one profile in the longitudinal direction, and an inscribed strip, which is inserted into the holding fixture and supports a holding strip that has a viewing surface on the front side.

2. Discussion of Related Art

A known housing with an inscribed strip is taught by German Patent Reference DE 94 21 342 U1, which involves a switch cabinet. In it, lateral casing components are provided, the edges of which have segments that are angled in a Z-shape from front to back, into which a profile piece is inserted, the front side of which has a holding fixture in the form of a groove-shaped recess for the inscribed strip. The inscribed strip itself has a flat, transparent holding strip behind which an inscription support is situated. The inscribed strip is slid into the groove in the longitudinal direction from the end and two longitudinal edges are overlapped by opposing edge sections of the C-shaped groove. This design requires a corresponding cost expenditure for parts and assembly and is suitable for the requirements of switch cabinets whose casings are of sheet metal walls.

According to German Patent Reference DE 34 03 114 A1, inscribed strips are inserted into a sheet metal casing in a cabinet casing, as well. When the sheet metal is cut to size, tabs that are bent into a Z-shape form the recess for a U-shaped metallic profile piece that is open toward the front and that accommodates the inscribed strip.

Swiss Patent Reference CH 610 463 A5 discloses an interchangeable electronic subassembly with a front side provided with a profile piece with a recess for an inscription. Swiss Patent Reference CH 429 872 discloses situating a band-shaped support, which has various inscriptions, in movable fashion in a sliding guide, behind a housing opening.

German Patent Reference DE 1 749 079 U1 discloses a decorative strip for appliance housings, which is comprised of the composite of a plastic strip in which an inserted metal foil band is enclosed in transparent plastic.

SUMMARY OF THE INVENTION

One object of this invention is to provide a housing or frame-like holding element to permit the housing or holding element to have an inscribed strip with the least amount of effort possible.

This object is attained with the features described in this specification and in the claims. In this case, the frame limbs forming the frame are in the form of frame profiles, at least one of which has the holding fixture for the inscribed strip and the back side of the holding strip oriented away from the visible side has two longitudinally extending resilient detent struts with detent elements that are parallel to each other and that engage in a detent fashion with counterpart detent elements in or on the holding fixture.

A simple attachment and replacement is facilitated by the holding strip embodied as essentially U-shaped in cross-section, the detent struts forming the legs of the U shape. The viewing surface supports the inscription or is transparent in order to make an inscription support visible when it is inserted between the detent struts behind the viewing surface.

Various other embodiments for the production and assembly include embodying the holding fixture as a groove-shaped recess with two opposing lateral boundaries on which the counterpart detent elements are formed as longitudinally extending recesses or protruding ribs, which engage in detent fashion with the detent elements, embodied in the form of ribs or conversely in the form of recesses, on the outside of the detent struts. It is also possible for the holding fixture to be in the form of a projection, the longitudinally extending, opposing lateral flanks of which have the counterpart detent elements that engage in detent fashion with the detent elements provided on the inside of the detent struts.

If longitudinally extending holding grooves are formed into the opposing insides of the detent struts, into which the longitudinal edges of the inscription support protrude, then it is possible for the inscription support to be inserted into the holding strip before the inscribed strip is mounted onto the housing and for the holding strip to be simply mounted at the same time as the inscribed strip.

A simple attachment is also facilitated by providing the lateral boundaries of the groove-shaped recess with insertion bevels or insertion curves that taper acutely inward toward each other, in the insertion direction of the inscribed strip, behind which the counterpart detent elements are situated.

A definite seating of the inscribed strip with a flush fit along the front surface and a prevention of dirt penetration are achieved if the two longitudinal edges of the viewing surface, or front wall, of the holding strip extend in the form of contact edges, beyond the beginnings of the U legs and in which the open outside of the holding fixture is provided with recesses that are essentially adapted to the contact edges in width and depth and have a support surface on their back side, in the insertion direction of the inscribed strip.

Additional attachment possibilities are achieved by providing a longitudinally extending thread groove in the groove bottom of the holding fixture, which is in the form of a groove-shaped recess.

If the frame profile has frontal flat regions adjoining both longitudinal sides of the holding fixture and has the flat region situated closer to the opening, by a shoulder that is recessed in relation to the front side, transitions into a flange-like support piece that is parallel to the plane of the opening and delimits the opening, then this achieves a flat integration of the inscribed strip into the front side, which, in the form of a wide frame, surrounds the opening that can be closed with a plate or an insert.

The housing design and the design of the holding element through integration of the holding fixture for the inscribed strip is also enhanced if the frame profile has a wall section of the housing or holding element, which wall section is integrally joined to it and protrudes back in the depth direction in relation to the front side.

A preferably flat, easy-to-assemble housing, which can be extended in the depth direction and whose front side permits inscribed strips to be attached in numerous places, in which a surrounding frame gives a uniform overall visual impression, is achieved if the respective wall section has a number of cavities extending in the longitudinal direction and if an upper frame profile, a lower frame profile, and two side frame profiles, each with the same cross section, are connected by four identical corner pieces whose frontal flat regions transition smoothly into the frontal flat regions of the frame profiles.

BRIEF DESCRIPTION OF THE DRAWINGS

Exemplary embodiments of this invention are explained in detail in view of the drawings, wherein.

DESCRIPTION OF PREFERRED EMBODIMENTS

Figure 1:
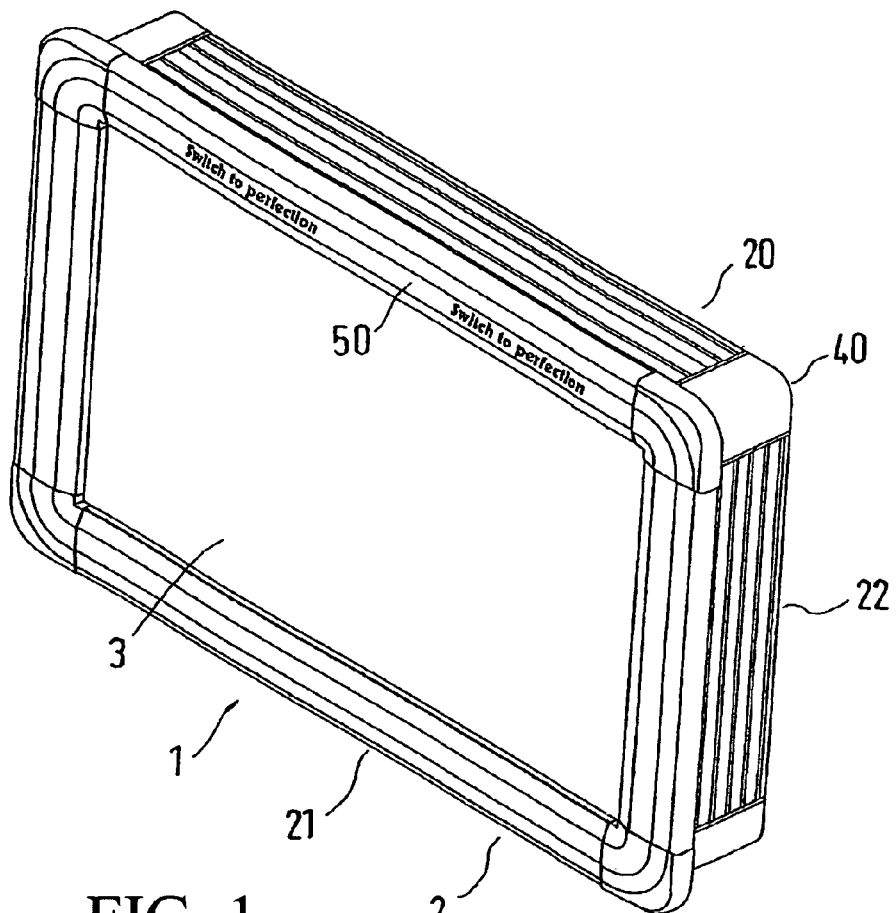
FIG. 1 shows a perspective view of a housing with uniform frame profiles and an inscribed strip.
Figure 4:
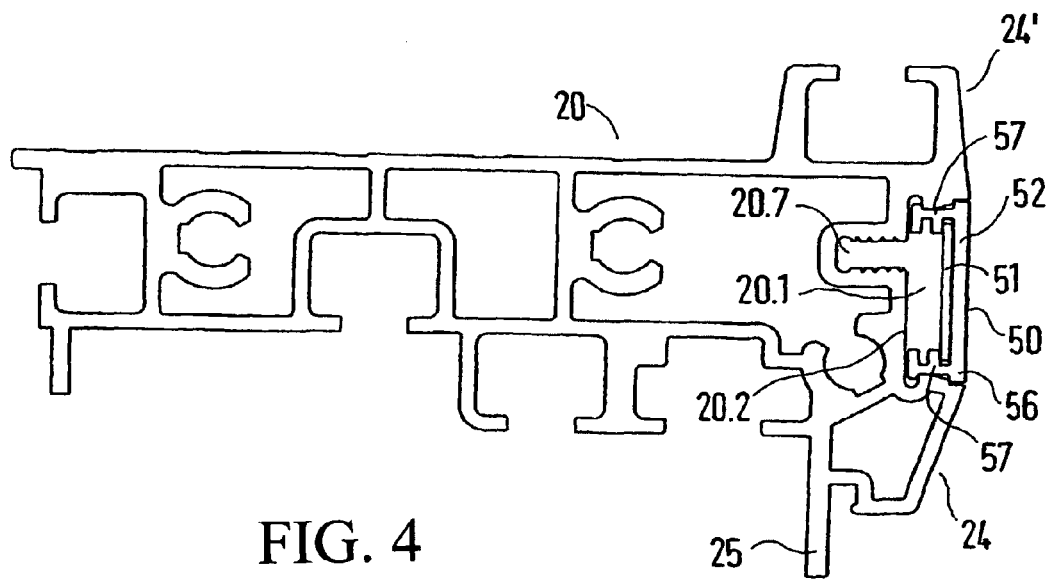
FIG. 4 shows a cross section taken through a frame profile of the housing, with an inscribed strip inserted.

A flat, essentially box-shaped housing 1 shown in FIG. 1 has a frame 2 that encloses a housing opening 3 and comprises four frame limbs with a uniform frame profile, namely an upper frame profile 20, a lower frame profile 21, and two lateral frame profiles 22 connected to each other by corner pieces 40 in the corner regions. The frame profiles 20, 21, 22 surrounding the rectangular frame 2 have relatively wide frame segments at the front, each of which has a holding fixture 20.1 in the form of a groove-shaped recess. Here, an inscribed strip 50 is inserted only into the holding fixture 20.1 of the upper frame profile 20. The front sections of the frame profiles 20, 21, 22, at their back ends, each transition in an integrally joined fashion into a respective rearward protruding upper, lower, or side wall section of the flat housing 1, as shown in FIG. 4, which depicts a cross section of the entire frame profile. In both the front region of the frame profiles 20, 21, 22 and also in the corner regions of the wall sections, the corner pieces 40 contribute to the impression of a visually continuous unit.

Figure 3:
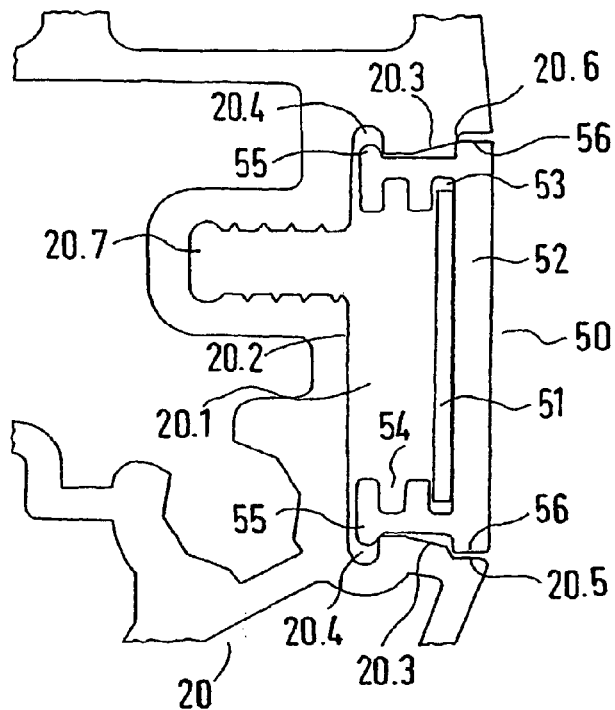
FIG. 3 shows a cross section taken through a frame profile segment of the housing, with an inscribed strip inserted.

As cross-sectionally shown in FIGS. 3 and 4, the holding fixtures 20.1 are essentially embodied in the form of shallow U-shaped recesses in the front sections of the frame profiles 20, 21, 22 that are formed into the front side, delimited by lateral boundaries and a groove bottom 20.2, and open toward the front. The lateral boundaries are adjoined on the inside toward the opening 3 and on the outside toward the outer edge of the frame 2 by frontal surface regions 24, 24' that are inclined slightly toward the rear, so that the side of the frontal section oriented toward the front, in connection with an inserted inscribed strip 50, appears relatively large in area and the inscribed strip stands out distinctively. The inner frontal surface region 24 transitions by a recessed shoulder into a strip-like support piece 25 whose free edge surrounds the opening 3 so that a covering of the opening 3 can be easily attached to the support piece 25. For simple attachment of the frame profiles 20, 21, 22 by the corner pieces 40, the frame profiles 20, 21, 22 have a number of cavities and/or thread channels extending over their lengths, particularly also in their wall section regions.

The lateral boundaries of the groove-shaped holding fixture 20.1 have insertion bevels 20.3 that taper acutely toward each other from the outside toward the inside, relative to a face normal of the front side, behind which lateral undercuts 20.4 are provided as counterpart detent elements for the detent elements 55 of the inscribed strip 50. Toward the front, the lateral boundaries of the holding fixture 20.1 each transition into a respective recess 20.5, the back side of which, oriented away from the front, forms a support 20.6. A thread groove 20.7 is formed into the groove bottom 20.2 and extends over the entire length.

Figure 2:
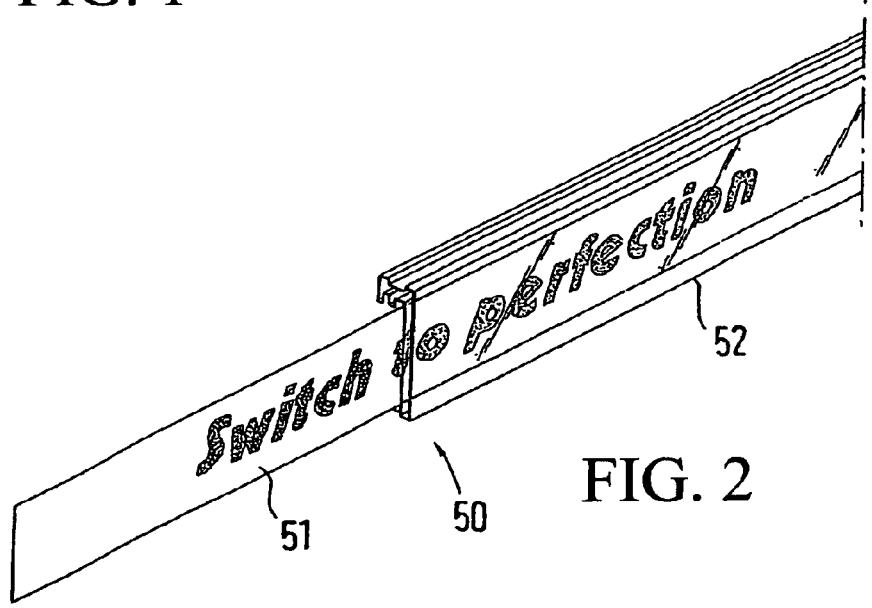
FIG. 2 shows a perspective view of an inscribed strip.

The inscribed strip 50 has a holding strip 52 with an essentially U-shaped cross section, which can either have an inscription itself or, as shown in FIGS. 2, 3, and 4, accommodates a sheet-shaped inscription support 21 on the back side of the viewing surface 52.1, which is then transparent. To facilitate insertion of the inscription support 51, which can contain information of any kind or other visual depictions, the inside of the two U legs have lateral opposing holding grooves 53 and in this case, also have an additional holding groove 54 that is recessed relative to the front. The holding strip 52, the free ends of whose U legs are to be inserted into the holding fixture 20.1, has, on its front, as an extension of the viewing surface 52.1, contact edges 56 that protrude from both sides beyond the beginning points of the U legs, are adapted to the recess 20.5, and with their back sides, rest against the supports 20.6 of the recess 20.5 when the inscribed strip 50 is in the inserted position. The depth of the recess 20.5 to the support 20.6 is adapted to the thickness of the contact edges 56 of the holding strip 52 so that a flush transition is produced on the front of the frame profile 20, 21, or 22. The U legs of the holding strip 52 are embodied in the form of resilient detent struts 57 with outer front end regions that have outwardly protruding detent elements 55 formed onto them, which, when holding strip 52 is in the inserted position, engage with spring tension in the undercuts or with counterpart detent elements 20.4 of the holding fixture 20.1, as shown in FIG. 3. As the holding strip 52 is inserted from the front, the insertion bevels 20.3 deflects the detent struts 57, comprised of the U legs, inward toward each other in opposition to their spring force and in the inserted position, their detent elements 55 engage in the undercuts 20.4 in detent fashion. The detent elements 55 and undercuts 20.4 are advantageously shaped so that the holding strips 52 can be detached and removed, such as by inserting a tool behind the end of the holding strip, which causes the detent struts 57 to pivot inward in opposition to their spring force. Similarly, with a corresponding design of the detent elements and counterpart detent elements, it is also possible to produce a detent connection that cannot be detached or can only be detached with difficulty. The fronts of the corner pieces 40 have an outer contour similar to that of the fronts of the frame profiles 20, 21, 22, to achieve a harmonious transition to the fronts of the frame profiles, thus producing a uniform, continuous overall visual impression. Unused holding fixtures 20.1, e.g. in the lower profile 21 and side profiles 22 can also be sealed shut with opaque sealing strips with a cross section corresponding to that of the holding strips 52. It is also possible, such as with bores provided at certain points along such a sealing strip or also in the holding strip 52, to secure the strip itself or to secure controls or the like by the thread groove 20.7 and screws that are screwed into the groove. The holding strips 52 can be comprised of plastic, but can also be made of a flexible metal, such as with inspection windows, or can be made of glass.

Alternative embodiment possibilities of the holding fixture 20.1 and inscribed strip 50 are disclosed in the claims and the specification.

The invention claimed is:

1. A housing, particularly for electronic or electrical components, having a frame (2) that surrounds an opening (3), a holding fixture (20.1) positioned in a front of at least one profile in a longitudinal direction, and an inscribed strip (50) inserted into the holding fixture and supporting a holding strip (52) including a viewing surface (52.1) on a front side, the housing comprising:

the frame limbs comprising the frame (2) provided in a form of frame profiles (20, 21, 22), at least one of the frame profiles (20, 21, 22) having the holding fixture (20.1) for the inscribed strip (50), a back side of the holding strip oriented away from a visible side with two longitudinally extending resilient detent struts (57) with detent elements (55) parallel to each other and engaging in a detent fashion with counterpart detent elements (20.4) in the holding fixture (20.1).

2. The housing as recited in claim 1, wherein the holding strip (52) has an essentially U-shaped cross-section, the detent struts (57) comprising the U legs and the viewing surface (52.1) one of supporting an inscription and embodied as transparent to permit an inscription support (51) to be viewed when inserted between the detent struts (57) behind the viewing surface.

3. The housing as recited in claim 2, wherein one of the holding fixture (20.1) is a groove-shaped recess with two opposing lateral boundaries on which the counterpart detent elements (20.4) are formed as one of longitudinally extending recesses and protruding ribs, which are engaged in the detent fashion by the detent elements (55) formed as one of ribs and recesses on an outside of the detent struts (57), and the holding fixture (20.1) is a projection with longitudinally extending lateral flanks oriented away from each other having the counterpart detent elements engaged in the detent fashion by the detent elements (55) on an inside of the detent struts (57).

4. The housing as recited in claim 3, wherein longitudinally extending holding grooves (53) are formed into opposing insides of the detent struts (57) into which longitudinal edges of the inscription support (51) protrude.

5. The housing as recited in claim 4, wherein lateral boundaries of the groove-shaped recess have one of insertion bevels (20.3) and insertion curves that taper acutely inward toward each other in an insertion direction of the inscribed strip (50) behind which the counterpart detent elements (20.4) are situated.

6. The housing as recited in claim 5, wherein two longitudinal edges of the viewing surface (52.1) extend as contact edges (56) beyond beginnings of the U legs and an open outside of the holding fixture (20.1) has recesses (20.5) essentially adapted to the contact edges (56) in width and depth and have a support surface (20.5) on a back side in an insertion direction of the inscribed strip (50).

7. The housing as recited in claim 6, wherein a longitudinally extending thread groove (20.7) is in the groove bottom of the holding fixture (20.1) which is formed as a groove-shaped recess.

8. The housing as recited in claim 7, wherein the frame profile has frontal flat regions (24, 24') adjoining both longitudinal sides of the holding fixture (20.1) and the flat region (24) situated closer to the opening (3) by a shoulder recessed relative to the front side, transitions into a flange-like support piece (25) that is parallel to a plane of the opening and delimits the opening (3).

9. The housing as recited in claim 8, wherein the frame profile has a wall section of the housing (1) integrally joined and protruding back in a depth direction relative to the front side.

10. The housing as recited in claim 9, wherein each respective wall section has a plurality of cavities extending in the longitudinal direction and an upper frame profile (20), a lower frame profile (21), and two side frame profiles (22), each with a same cross section, are connected by four identical corner pieces (40) with frontal flat regions that transition smoothly into second frontal flat regions of the frame profiles (20, 21, 22).

11. The housing as recited in claim 2, wherein longitudinally extending holding grooves (53) are formed into opposing insides of the detent struts (57) into which longitudinal edges of the inscription support (51) protrude.

12. The housing as recited in claim 2, wherein two longitudinal edges of the viewing surface (52.1) extend as contact edges (56) beyond beginnings of the U legs and an open outside of the holding fixture (20.1) has recesses (20.5) essentially adapted to the contact edges (56) in width and depth and have a support surface (20.5) on a back side in an insertion direction of the inscribed strip (50).

13. The housing as recited in claim 3, wherein lateral boundaries of the groove-shaped recess have one of insertion bevels (20.3) and insertion curves that taper acutely inward toward each other in an insertion direction of the inscribed strip (50) behind which the counterpart detent elements (20.4) are situated.

14. The housing as recited in claim 3, wherein a longitudinally extending thread groove (20.7) is in the groove bottom of the holding fixture (20.1) which is formed as a groove-shaped recess.

15. The housing as recited in claim 1, wherein one of the holding fixture (20.1) is a groove-shaped recess with two opposing lateral boundaries on which the counterpart detent elements (20.4) are formed as one of longitudinally extending recesses and protruding ribs, which are engaged in the detent fashion by the detent elements (55) formed as one of ribs and recesses on an outside of the detent struts (20.8), and the holding fixture (20.1) is a projection with longitudinally extending lateral flanks oriented away from each other having the counterpart detent elements engaged in the detent fashion by the detent elements (55) on an inside of the detent struts (57).

16. The housing as recited in claim 1, wherein the frame profile has frontal flat regions (24, 24') adjoining both longitudinal sides of the holding fixture (20.1) and the flat region (24) situated closer to the opening (3) by a shoulder recessed relative to the front side, transitions into a flange-like support piece (25) that is parallel to a plane of the opening and delimits the opening (3).

17. The housing as recited in claim 1, wherein the frame profile has a wall section of the housing (1) integrally joined and protruding back in a depth direction relative to the front side.

18. The housing as recited in claim 1, wherein each respective wall section has a plurality of cavities extending in the longitudinal direction and an upper frame profile (20), a lower frame profile (21), and two side frame profiles (22), each with a same cross section, are connected by four identical corner pieces (40) with frontal flat regions that transition smoothly into second frontal flat regions of the frame profiles (20, 21, 22).

* * * * *